(12) United States Patent
Liu et al.

(10) Patent No.: US 8,802,538 B1
(45) Date of Patent: Aug. 12, 2014

(54) METHODS FOR HYBRID WAFER BONDING

(71) Applicant: Taiwan Semiconductor Manufacturing Company, Ltd., Hsin-Chu (TW)

(72) Inventors: Ping-Yin Liu, Yonghe (TW); Jen-Cheng Liu, Hsin-Chu (TW); Xiaomeng Chen, Hsin-Chu (TW); Xin-Hua Huang, Xihu Township (TW); Hung-Hua Lin, Taipei (TW); Lan-Lin Chao, Sindian (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/927,477

(22) Filed: Jun. 26, 2013

Related U.S. Application Data

(60) Provisional application No. 61/793,766, filed on Mar. 15, 2013.

(51) Int. Cl.
*H01L 21/30* (2006.01)
(52) U.S. Cl.
USPC ............... 438/455; 438/692; 257/E21.48

(58) Field of Classification Search
CPC .................................................... H01L 21/447
USPC ................. 257/E21.48, E21.483, E21.484
See application file for complete search history.

(56) References Cited

U.S. PATENT DOCUMENTS

2012/0100657 A1* 4/2012 Di Cioccio et al. ............. 438/51

\* cited by examiner

*Primary Examiner* — Cheung Lee
(74) *Attorney, Agent, or Firm* — Slater and Matsil, L.L.P.

(57) ABSTRACT

Methods for hybrid wafer bonding. In an embodiment, a method is disclosed that includes forming a metal pad layer in a dielectric layer over at least two semiconductor substrates; performing chemical mechanical polishing on the semiconductor substrates to expose a surface of the metal pad layer and planarize the dielectric layer to form a bonding surface on each semiconductor substrate; performing an oxidation process on the at least two semiconductor substrates to oxidize the metal pad layer to form a metal oxide; performing an etch to remove the metal oxide, recessing the surface of the metal pad layer from the bonding surface of the dielectric layer of each of the at least two semiconductor substrates; physically contacting the bonding surfaces of the at least two semiconductor substrates; and performing a thermal anneal to form bonds between the metal pads of the semiconductor substrates. Additional methods are disclosed.

20 Claims, 9 Drawing Sheets

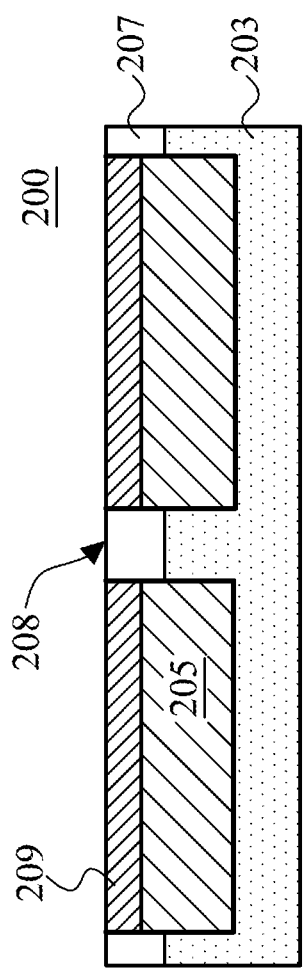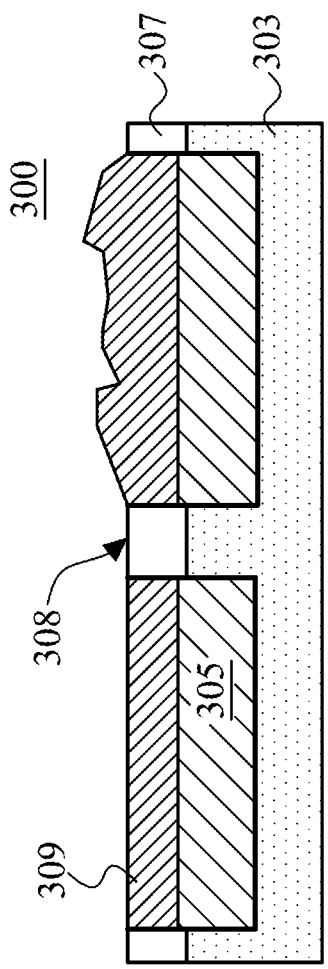

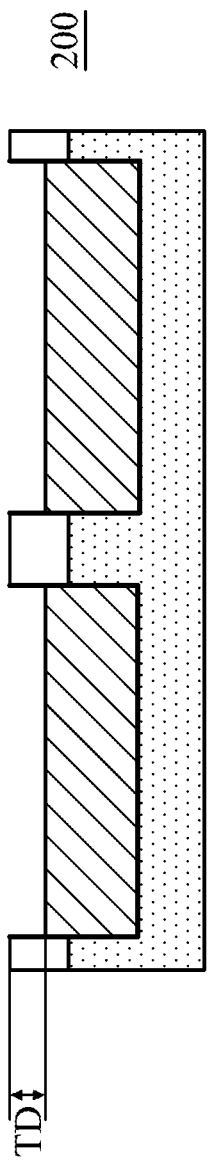
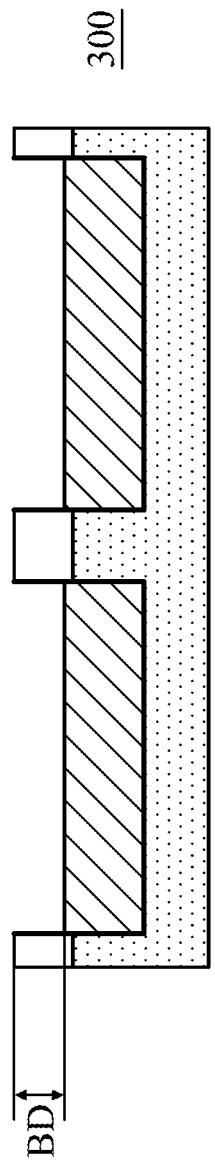

METHODS FOR HYBRID WAFER BONDING

RELATED APPLICATIONS

This application is related to U.S. Provisional Patent Application No. 61/793,766, filed Mar. 15, 2013, entitled "Methods for Hybrid Wafer Bonding" which application is also hereby incorporated herein by reference in its entirety.

TECHNICAL FIELD

The embodiments relate generally to the use of bonding between substrates, which include but are not limited to semiconductor wafers. The bonds are formed between substrates using profile matching of corresponding metal regions to form well mated surfaces and achieve robust bonded connections between the metal regions using low thermocompression forces at low processing temperatures. The use of wafer bonding is applicable to a wide variety of devices where two substrates are bonded including 3D IC and in particular CMOS image sensor devices.

BACKGROUND

Recent improvements for wafer bonding are increasingly important in 3D IC structures. In wafer bonding, two semiconductor wafers are bonded together to form a three dimensional stack without the need for an intervening substrate or device. In applications where two different wafer types are needed, this approach can provide a single device with both functional devices in one package. In one particular application, CMOS image sensors, a substrate including an array of image sensors may be bonded to a circuit wafer so as to provide a 3D IC system that includes all of the circuitry needed to implement an image sensor in the same board area as the array of sensors, providing a complete image sensing solution in a single packaged integrated circuit device.

Wafer bonding approaches known previously include oxide-oxide or fusion bonding, and metal to metal bonding using thermocompression bonding which is performed at high pressure and using high temperatures. These prior approaches induce high mechanical and thermal stress on the devices, or fail to provide needed metal-to-metal connections.

BRIEF DESCRIPTION OF THE DRAWINGS

For a more complete understanding of the illustrative embodiments described herein and the advantages thereof, reference is now made to the following descriptions taken in conjunction with the accompanying drawings, in which:

FIGS. 3A and 3B illustrate, in cross-sectional views, the top and bottom substrates of FIGS. 2A and 2B following additional process steps;

FIGS. 4A and 4B illustrate, in cross-sectional views, the top and bottom substrates of FIGS. 3A and 3B following additional process steps;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
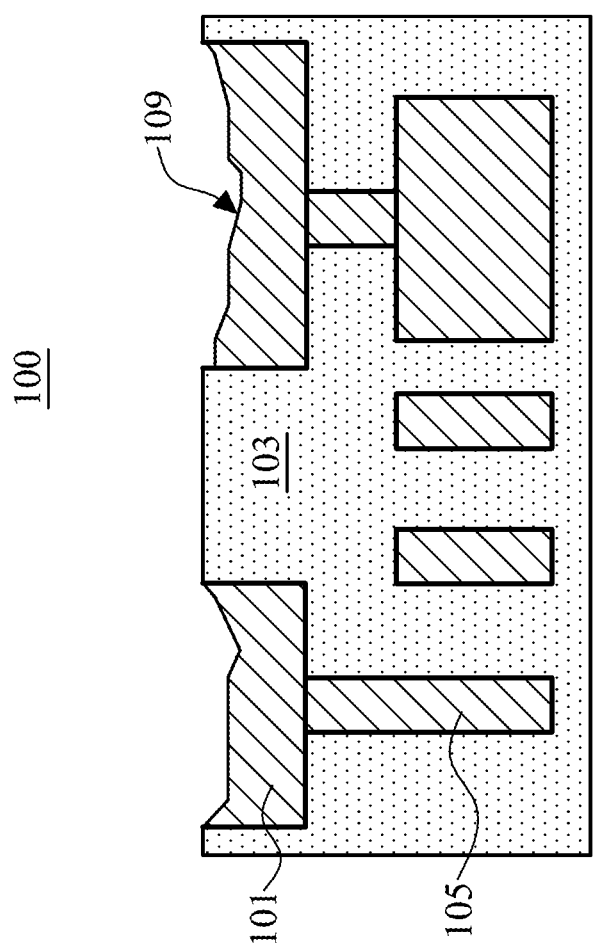
FIG. 1 illustrates, in a cross-sectional view, a portion of a substrate used to illustrate the embodiments.

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification, or the appended claims.

The use of wafer bonding to provide higher integration in semiconductor devices by producing 3D devices is increasing. The embodiments provide methods for metal to metal bonding with robust connections at the interface between two substrates. In some embodiments, the substrates are semiconductor substrates and in some embodiments the substrates are semiconductor wafers. In an embodiment, at least one of the substrates includes an array of image sensors. In an embodiment the substrates include a donor wafer that provides metal connections and through via connections, this donor wafer may be bonded to another device wafer, and then the substrate of the donor wafer may be ground away using a mechanical grinding or CMP approach, leaving the metal layers bonded to the device wafer. In an embodiment, a number of wafers may be bonded to form a 3D IC structure with multiple layers.

In the embodiments, metal pads on the bonding faces of both substrates are exposed using chemical mechanical processing (CMP) and the surfaces are planarized. A metal oxide layer is then formed by oxidation of the exposed metal pads. In the embodiments, the process conditions are carefully controlled during the oxidation process. Following the oxidation process, a well-controlled etch process is used to remove the metal oxide from the metal pads, exposing the surfaces. In various embodiments, wet etching processes are used. The control of the oxidation process and the wet etch processes used provides metal pads with surface profiles that are extremely well matched. Two substrates are then aligned in face to face relation and the respective metal pads are brought into proximity, while the surrounding dielectric material of the two substrates is brought into contact. Fusion bonding may occur between the dielectric layers on contact. An anneal process is used to cause bonding between the metal pads and to strengthen the bonds between the dielectric layers, performing a hybrid bonding process. Because the metal pads have matched surface profiles within certain parameters, the metal pads form robust bonds even at relatively low process temperatures and without the need for high mechanical pressure.

In various embodiments, the metal for the metal pads is one of copper (Cu), aluminum (Al), aluminum copper (AlCu), nickel (Ni), aluminum germanium (AlGe) and alloys of these metals. The metal pads are formed as damascene structures in a dielectric material. The dielectric materials in various embodiments is chosen from oxides such as $SiO_2$, nitrides such as SiN, silicon oxynitride (SiON), and high-k dielectrics used in semiconductor devices.

In one embodiment, copper metal pads are formed surrounded by dielectric material using a damascene or dual damascene metallization scheme. After chemical-mechanical polishing (CMP) and planarization, the substrates are subjected to an oxidation process. In one example embodiment, copper oxide is formed using $O_2$ plasma. In alternative embodiments, other oxidation processes are used. A steam oxidation process such as in situ steam generation (ISSG) can be used.

Copper oxide removal is then performed by wet etch processing. In one embodiment, a dilute HF etch is used. In alternative embodiments, the wet etch is chosen from oxide etches including DHF at 2% concentration, HCl, HCOOH, citric acid. In some embodiments, the temperatures in the etch process are less than 250 degrees C.

Following the removal of the copper oxide, the substrates are inspected for copper pad profile match. The pads may be recessed slightly from the surface of the dielectric material. The formation of the copper oxide followed by a well-controlled etch process reduces or eliminates the non-uniform surfaces that result from the CMP processes, such as dishing. Control of the process allows for creation of slightly convex or concave and highly uniform surfaces on the surfaces of the copper pads.

By use of the embodiment methods, the copper pads have more or less uniform surfaces. The recess depth of the copper pads is well matched between the copper pads on the top substrate, and the corresponding copper pads on the bottom substrate. The top and bottom substrate that are selected with the well matched copper pad profiles are brought into alignment and then placed in contact, with the dielectric layers in physical contact and the copper pads of the top and bottom substrates being spaced slightly apart. The dielectric surfaces of the substrates are placed in good contact. Fusion bonding of the dielectric layers may begin. Once the substrates are initially placed in physical contact, a relatively low temperature anneal is performed. During the anneal, the respective copper pads form seamless bonds. The bonding between the dielectric layers will continue or bond strength will continue to increase during the anneal. When the surface profiles of the copper pads are well matched and the metal pad recess depths are within certain predetermined ranges, robust bonds are formed. This is referred to as a "seamless" bond where the copper material appears to be uniform across the bonding interface. The dielectric surfaces also bond in the hybrid bonding process.

FIG. 1 illustrates, in a cross sectional view, a portion of a substrate 100. The substrate may be a semiconductor substrate such as a silicon, gallium arsenide, germanium or indium substrate. A plurality of metal layers and dielectric layers are formed over the substrate 100 as is known in the art. In the embodiments, a layer of metal 101 is shown at the upper surface of substrate 100. The metal 101 is formed using a damascene process such as a single or dual damascene process. After the conductors of metal 101 are formed, a chemical mechanical polishing (CMP) process is used to remove any overburden metal that remains after the electroplating process, and the CMP also polishes the surface of the dielectric 103 to form a bonding surface. The remaining underlying layers of the metal and dielectric in FIG. 1 may form wiring patterns for a semiconductor device. Vias such as 105 may be used to form vertical connections between metal layers. While not shown, active devices such as transistors may also be formed on substrate 100. In another embodiment, the substrate 100 may include image sensor devices to form a CMOS image sensor substrate, for example.

Also as shown in FIG. 1, the upper surface of the metal pads 101 after CMP will be non-uniform. Even though the CMP processes used to planarize the metal 101 are constantly improving, effects such as dishing or over polishing, which cause recessed areas, and hillocks or high areas, are still present. While adding dummy metal patterns to increase uniformity, changing slurry compositions, and other compensation approaches are used to improve the CMP results, the CMP processes do not produce a perfectly uniform surface on the metal pads 101. Region 109 shows a CMP dishing effect, for example.

Figure 2A:
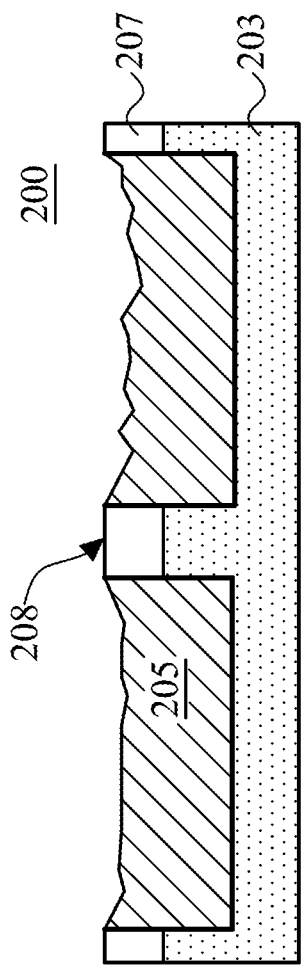
FIGS. 2A and 2B illustrate, in cross-sectional views, a top and bottom substrate at an intermediate process step.
Figure 2B:
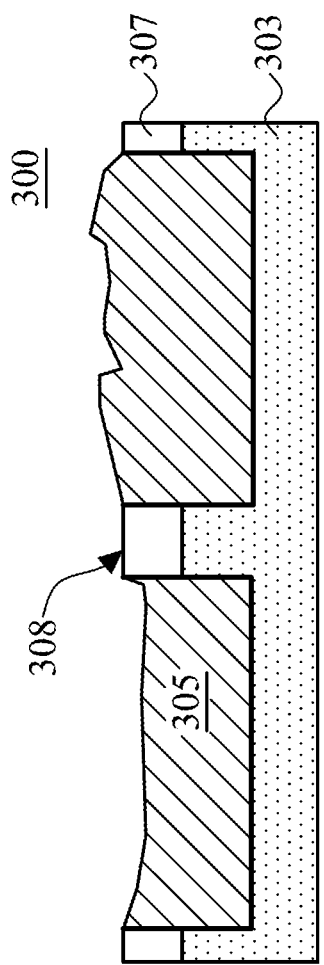

FIGS. 2A and 2B depict, in cross sectional views, a top substrate 200 and a bottom substrate 300 to illustrate an example embodiment method. In FIG. 2, substrate 200 is shown at an intermediate process step following a CMP process. Pads 205 are formed of metal. In an example embodiment, the metal is copper. Interlevel dielectric 203 is shown below the metal pad layer 205. A dielectric 207 is shown surrounding the metal pads 205. As in FIG. 1, the surfaces of the metal pads 205 are irregular due to CMP effects. The surface of dielectric 207 forms a bonding surface 208 for the top substrate.

Similarly in FIG. 2B, a bottom substrate 300 is shown at the same intermediate process step, following CMP. The metal pads 305 are shown with similar, but slightly different, irregular surfaces. Dielectric 307 and interlevel dielectric 303 are also shown. The surface 308 of dielectric 307 forms a bonding surface for the bottom substrate 300.

FIGS. 3A and 3B depict the top substrate 200 and the bottom substrate 300 after an oxidation process is performed on the metal pads 205. In an embodiment, the metal pads are copper and the oxidation 209 and 309 forms copper oxide. The oxidation process may be an $O_2$ plasma process, thermal oxidation process, in situ steam generation oxidation process (ISSG), or other oxidation process. In the method embodiment, the oxidation process is controlled to form an oxide layer of a particular depth from the top surface. However, note that a portion of the substrate 300 has an oxide layer 309 that extends above the surface of the dielectric 307. Referring to FIG. 2B above, the same portion of the metal 305 also extended above the surface of pad 307. Thus, the pattern is repeated in the oxidation of the copper 305.

FIGS. 4A and 4B depict, in cross-sectional views, the top substrate 200 and the bottom substrate following additional processing. In FIGS. 4A and 4B, the substrates 200 and 300 are shown after an oxide etch is performed to remove the copper oxide layers from the substrates. In an embodiment, a dilute HF etch solution of about 2% concentration is used. Various alternative embodiments include HCL, HCOOH, and citric acid etches. In the embodiments the etch process is closely controlled to remove the metal oxide to a controlled depth. In FIG. 4A, the recess depth of the top substrate 200 is shown as "TD" which is the distance from the upper surface of the dielectric layer to the top surface of the metal pads. Similarly, in FIG. 4B, the recess depth of the bottom substrate 300 is shown as "BD".

Figure 5:
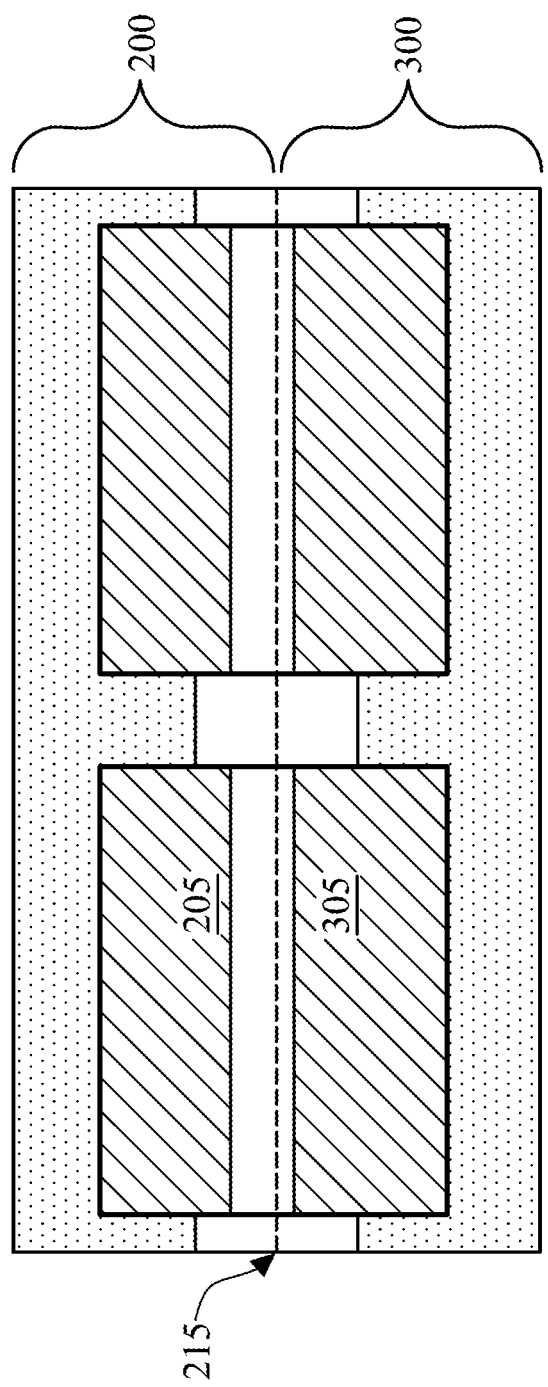
FIG. 5 illustrates, in another cross-sectional view, the top and bottom substrates of FIGS. 4A and 4B in a bonding process.

FIG. 5 depicts, in a cross sectional view, the alignment and contact bonding of the top substrate 200 and the bottom substrate 300. At this stage, the top substrate is turned over and oriented with the bonding surface face to face with the bonding surface of substrate 300, the features are aligned, and the top and bottom substrates are moved into physical contact between the dielectric layers. A bonding interface 215 is shown in FIG. 5. Fusion bonding may begin between the respective dielectric layers at contact. The copper pads 205 and 305, while in close proximity, are spaced apart slightly at this stage in the process. However, it has been discovered that if the surface profiles and/or recess depth of the metal pads meet certain criterion, robust bonding is achieved between the metal pads, as is described below.

Figure 6:
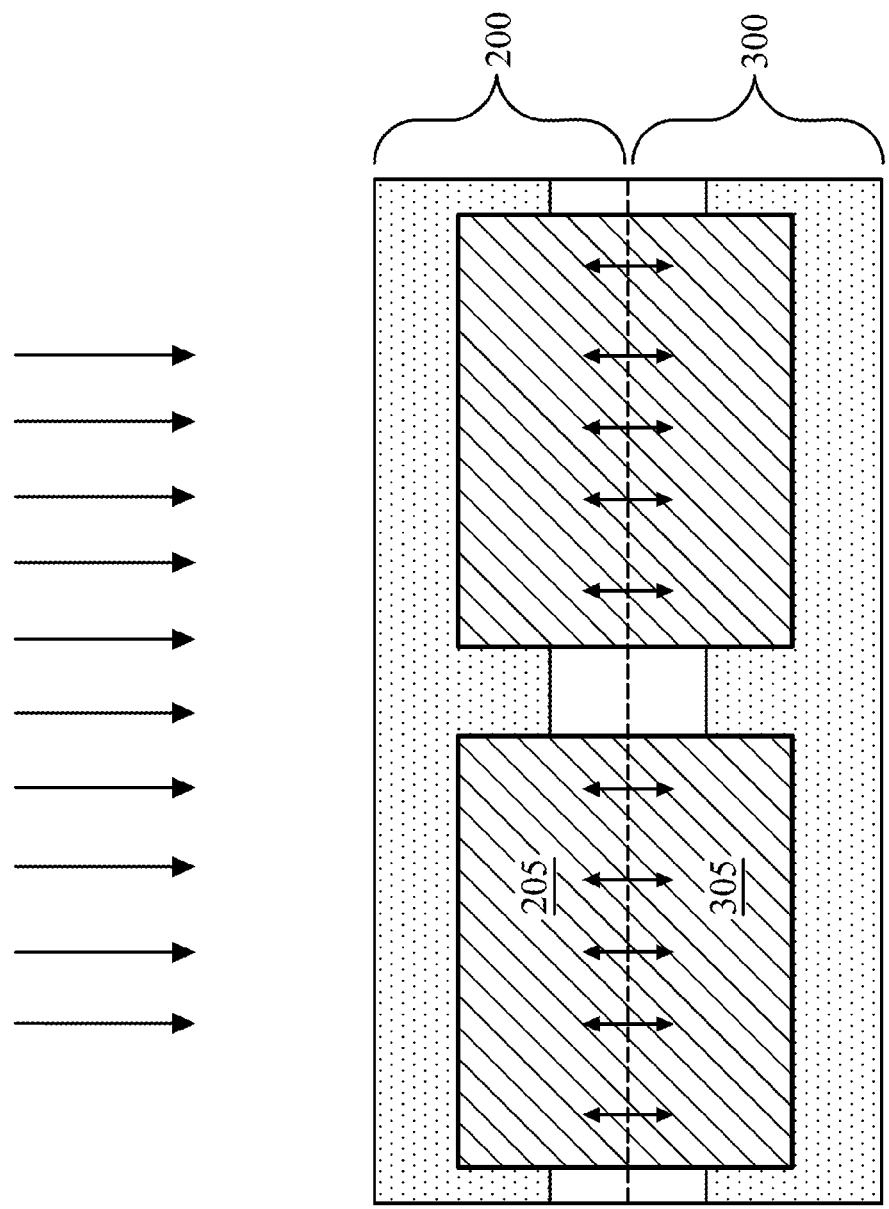
FIG. 6 illustrates, in another cross-sectional view, the top and bottom substrates of FIG. 5A in an anneal process.

FIG. 6 depicts, in another cross sectional view, an additional process step of the embodiment method applied to substrates 200 and 300. In FIG. 6, an anneal is performed on the top and bottom substrates 200 and 300, which are already in contact. The copper pads 205 and 305 will bond and a seamless bond will form as shown in FIG. 6. The pad-to-pad bond formed using the embodiments method is of sufficient bond strength to support the remaining process steps.

The anneal temperature can vary between about 100 and about 400 degrees C. The time of the anneal can vary from a few seconds, to minutes to several hours, the bond strengths obtained will increase with additional anneal time. Note that while an ultrahigh vacuum is not required to use the embodiments, the metal pads will tend to oxidize after the etch process if the atmosphere is not controlled, use of a low vacuum, or use of an inert gas to purge the anneal chamber, can be used to prevent or reduce the formation of unwanted metal oxides after the oxide etch process is completed, as described above.

Figure 7:
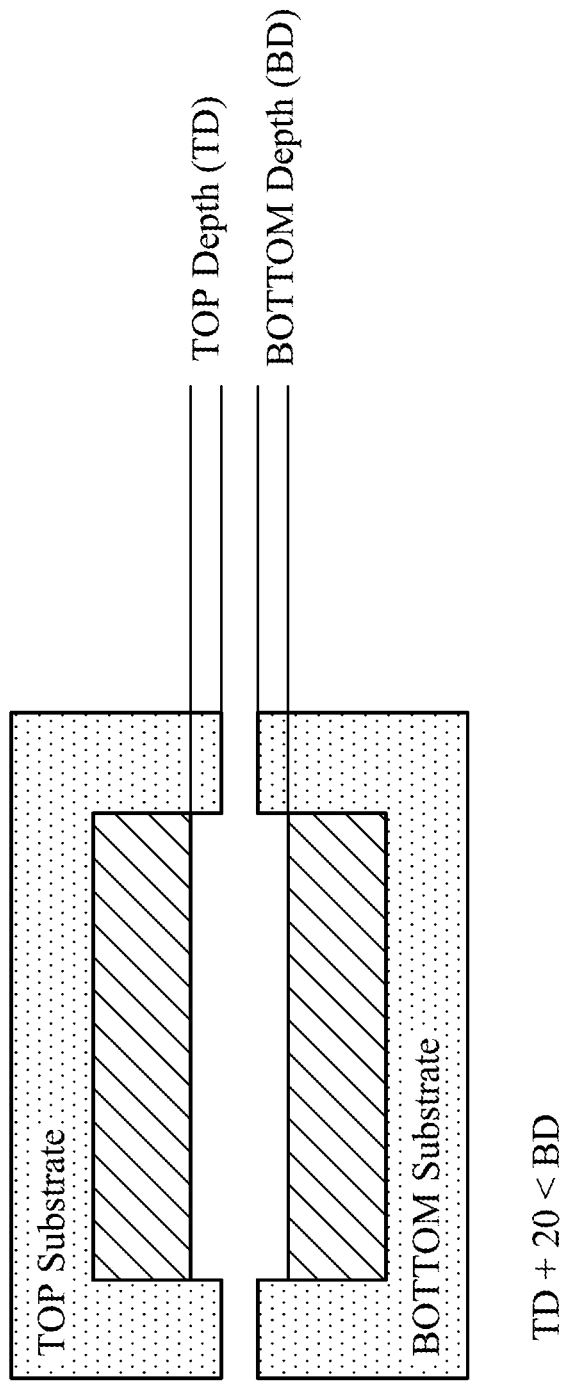
FIG. 7 illustrates, in a cross-sectional view, a profile matching parameter applied in an embodiment.
Figure 8:
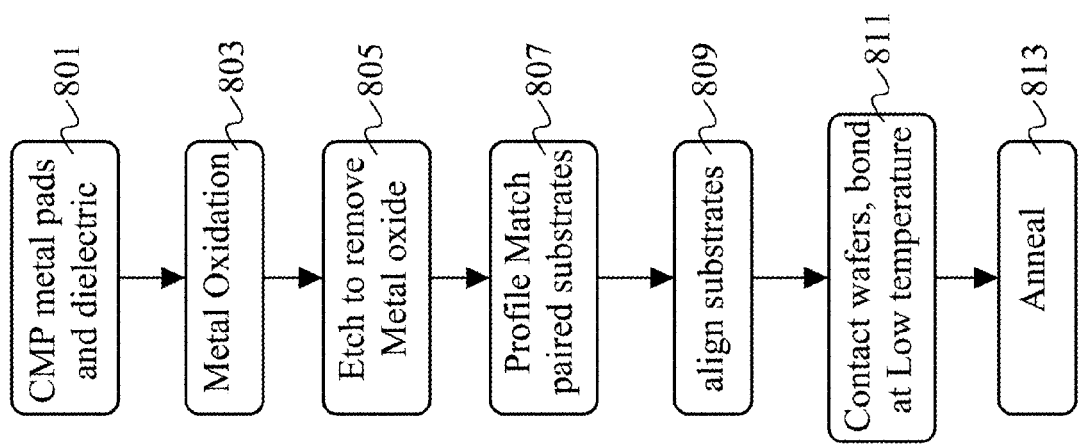
FIG. 8 illustrates, in a flow diagram, the steps of a method embodiment.

The profile matching of the embodiments provides excellent metal pad to metal pad bonds when the metal pads are well matched. FIG. 8 depicts in a cross section top substrate 200 and bottom substrate 300. Each has a corresponding recess or pad depth below the surface of the dielectric as shown. The top depth TD is the distance from the surface of the metal pad to the dielectric surface of the top substrate 200, the bottom depth BD is the distance from the surface of the dielectric on the bottom substrate 300 to the surface of the metal pad 305. In one method embodiment, the substrates are determined to have a good profile match for forming a pad-to-pad bond if the top depth TD in Angstroms, +20, is less than the bottom depth BD in Angstroms, as shown in FIG. 7. This is one embodiment of a profile match parameter. Other profile match parameters can be used to form additional method embodiments. For example, in another embodiment, if the recess depth of both top and bottom substrates TD and BD is determined to be less than 10 Angstroms, this pair of substrates to meets a profile match criterion. In prototype embodiments, sample substrates were sorted into groups based on the amount of dishing or protrusion measured at the metal pads using atomic force microscopy (AFM) and pairs of top and bottom substrates were bonded. A group "A" was defined having dishing from −260 Angstroms to −20 Angstroms, (where 0 Angstroms would be a planar surface at the ideal level after the oxide etch). A second group, "B" was identified having dishing or protusions between −30 Angstroms to +10 Angstroms. A third group, "C", was identified having dishing or protrusions between −10 Angstroms to +10 Angstroms. By selecting top and bottom substrates from the groups, successful bonding was performed between the group A substrates, and between group A and group B substrates. By using matched profiles in the top bottom substrates, the hybrid bonding process forms robust bonds without mechanical pressure and at low temperatures.

FIG. 8 illustrates, in a flow diagram, the steps of a method embodiment. In step 801, at least two substrates are subjected to CMP processing to expose the metal pads and planarize the bonding surfaces of the dielectrics. At step 803, a controlled oxidation process is performed to oxidize the metal pads to a certain depth. At step 805, a controlled etch is performed to remove the metal oxide leaving a uniform surface on the metal pads recessed below the dielectric surface. At step 807, the substrates are checked for a profile match that meets a predetermined criterion for a good bond. In an embodiment, the criterion is that the top depth (recess distance, in Angstroms, from the upper surface of the bonding face dielectric of the top substrate to the surface of the metal pads of the top substrate)+20 is less than the bottom depth (the recess distance, in Angstroms, from the top surface of the bonding face dielectric on the bottom substrate to the surface of the metal pads on the bottom substrate). Once suitable substrates with a profile match are identified, at step 809 the chosen top and bottom substrates are aligned in a face to face relation. At step 811, the substrates are placed into physical contact at low or room temperature. The dielectric surfaces may begin fusion bonding at this stage in the process. At step 813, a relatively low temperature anneal is performed. The anneal can vary in temperature from 40 degrees C. to over 250 degrees C. and up to 400 degrees C., for example, and the anneal time can vary from a few seconds to a few minutes and up to several hours. During the anneal, metal pad to metal pad bonding occurs. The hybrid bonding process of the embodiments thus forms bonds between both the respective dielectric layers and between the respective metal pads, and the bonds are of sufficient bond strength to support the remaining processes used in completing the devices.

In an example embodiment, the metal pads are copper. In additional embodiments, the metal pads can be chosen from copper (Cu), aluminum (Al), aluminum copper (AlCu), nickel (Ni), aluminum germanium (AlGe), and alloys of these metals. The dielectric materials in various embodiments are $SiO_2$, nitrides such as SiN, silicon oxynitride (SiON), and/or high-k dielectrics used in semiconductor devices.

In an example embodiment, a dilute HF wet etch is used. In alternative embodiments the wet etch is chosen from oxide etches including DHF at 2% concentration, HCl, HCOOH at greater than 2% and citric acid. In various embodiments, the temperatures in the etch process are less than 250 degrees C.

Figure 9:
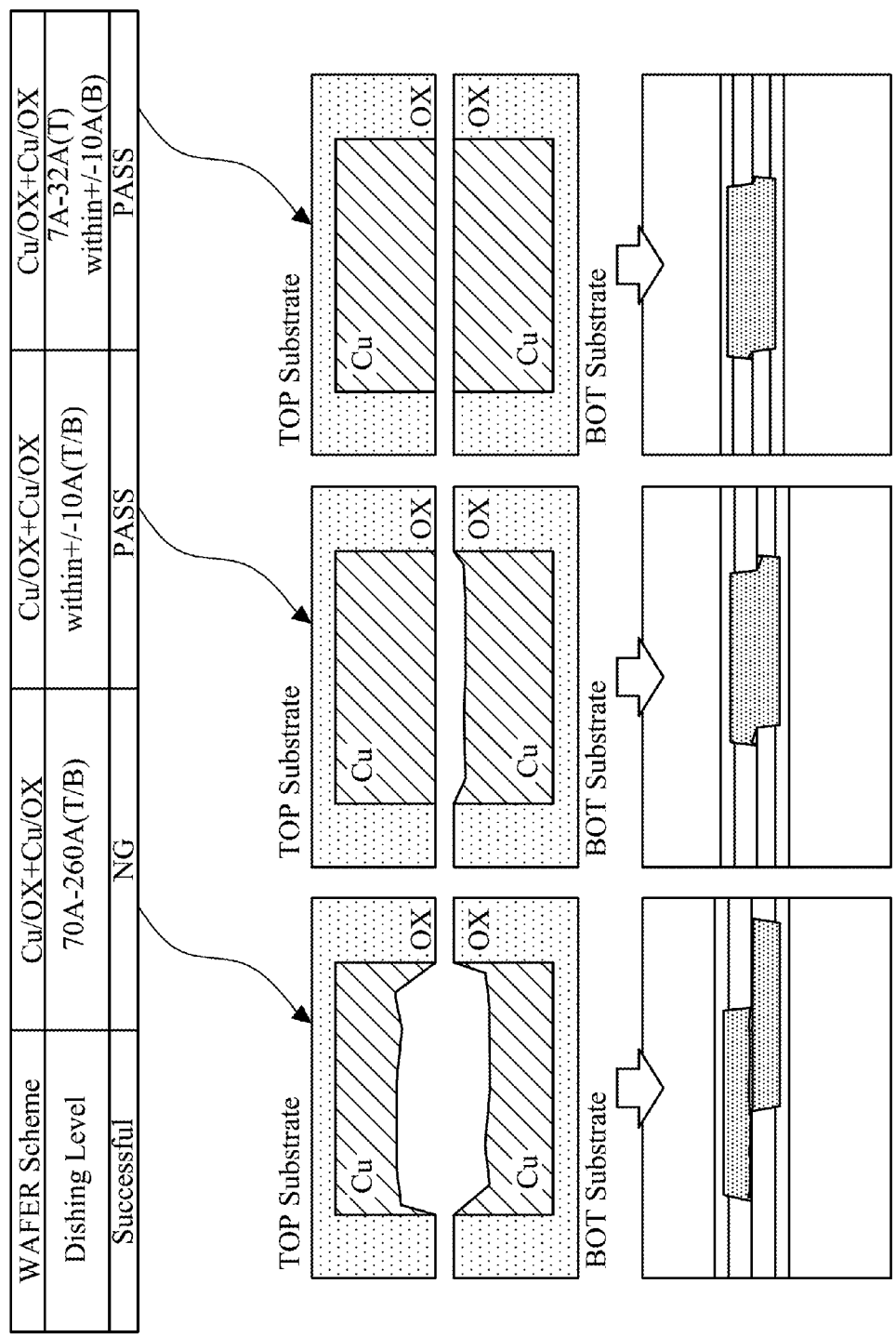
FIG. 9 illustrates, in a comparison table, results obtained by use of the embodiments to form example structures.

FIG. 9 presents, in table form including SEM images, a comparison between a wafer bonding performed without the profile matching of the embodiments, and two examples using the embodiments. In the first example, after CMP, the dishing level is shown as 70 Angstroms (top substrate) and 260 Angstroms (bottom substrate). The profiles of the pad surfaces as shown in FIG. 9 are rough, and non-planar and do not meet a profile match criterion of the embodiments. The SEM image for this example shows a visible seam between the copper pads of the top and bottom surfaces. That is, the bond between the copper metal pads was not successfully formed.

In contrast, the other two examples shown in FIG. 9 illustrate the use of the embodiment methods to form seamless bonds in copper pads. In the middle column, an example is shown with minimal dishing, the top and bottom surfaces are within 10 Angstroms of the dielectric surface, and as shown in the SEM image, a seamless bond is formed between the copper pads of the top and bottom substrates. Finally, the third column illustrates the wide process window that the use of the embodiments provides. In the third column, the dishing includes a 7 Angstrom to 32 Angstrom dishing of the top substrate, however the bottom substrate is +/−10 Angstroms. As shown in the SEM image for the third column in FIG. 9, this pairing also resulted in a seamless bond between the copper pads.

Use of the embodiments advantageously provides robust dielectric bonds and metal pad bonds at relatively low process temperatures. In sharp contrast to the thermocompressive bonding techniques used previously, the stresses on the semiconductor substrates which can lead to oxide cracking and delamination, and erosion effects on the dielectric layer, are reduced or eliminated. Lower temperature processing prevents problems due to the coefficient of thermal expansion (CTE) mismatch between materials, which can cause delamination and cracking. The need to recess the dielectric layer to expose the copper pads above the dielectric layer for thermocompressive metal bonding is also eliminated by use of the embodiments. Erosion of the dielectric layers due to the etching processes in the prior approaches is reduced or eliminated.

In an embodiment, a method includes forming a metal pad layer in a dielectric layer over at least two semiconductor substrates; performing chemical mechanical polishing on the semiconductor substrates to expose a surface of the metal pad layer and planarize the dielectric layer to form a bonding surface on each semiconductor substrate; performing an oxidation process on the at least two semiconductor substrates to oxidize the metal pad layer to form a metal oxide; performing an etch to remove the metal oxide, recessing the surface of the metal pad layer from the bonding surface of the dielectric layer of each of the at least two semiconductor substrates; physically contacting the bonding surfaces of the at least two semiconductor substrates; and performing a thermal anneal to form bonds between the metal pads of the semiconductor substrates.

In a further embodiment, the above method includes forming a metal taken from the group consisting essentially of copper, aluminum, copper aluminum, nickel, aluminum germanium, and alloys thereof. In yet another method embodiment, the above method includes forming copper. In yet another embodiment, the above method includes performing a thermal oxidation. In still another embodiment, in the above methods, performing an oxidation process includes one of an O2 plasma, thermal oxidation, and in situ steam generation oxidation.

In still another embodiment, in the above methods, performing an etch comprises performing an etch using dilute HF. In still another embodiment, performing an etch to remove the metal oxide comprises one of dilute HF, HCl, HCOOH, and citric acid etches. In yet another embodiment, performing the above methods, and further comprising performing the etch at temperatures that are less than 250 degrees C. In still another embodiment, in the above methods, the anneal is performed at a temperature of greater than 100 degrees C. In yet a further embodiment, in the above methods the anneal is performed at a temperature of greater than 250 degrees C. In another embodiment, in the above methods, wherein after the oxide removal, the metal pads are recessed beneath the bonding surface of the semiconductor substrates by less than 10 Angstroms.

In still another embodiment, in the above methods, wherein surface profiles of the metal pads of the at least two semiconductor substrates after the oxide removal meet a predetermined profile match parameter.

In another embodiment, a method of bonding semiconductor wafers includes forming a metal pad layer in a dielectric layer on at least two semiconductor wafers; performing a CMP process on each of the at least two semiconductor wafers to expose the metal pad layer and planarize the dielectric layer to form a bonding face on each of the at least two semiconductor wafers; performing an oxidation process on each of the at least two semiconductor wafers to form a metal oxide layer to a predetermined depth in the metal pad layers; performing an oxide etch process on each of the at least two semiconductor wafers to remove the metal oxide, exposing a recessed planar surface of each of the metal pad layers; determining that the planar surface of each of the metal pad layers meets a profile match criterion; responsive to the determining, aligning the bonding faces on the at least two semiconductor wafers in a face to face relation; physically contacting the bonding faces of the at least two semiconductor wafers; and annealing the at least two semiconductor wafers; wherein bonding occurs between respective the dielectric layers and between the respective metal pad layers of the at least two semiconductor wafers.

In still a further method embodiment, the above method includes wherein the profile match criterion comprises a recess depth from the surface of the dielectric layer to the planar surface of the metal pad layer of less than or equal to 10 Angstroms. In still another embodiment, in the above method, wherein the profile match criterion comprises determining that a recess depth of one of the semiconductor wafers from the surface of the dielectric layer to the planar surface of the metal pad layer in Angstroms plus 20 is less than the recess depth from the surface of the dielectric layer to the planar surface of the metal pad layer in Angstroms of the other one of the semiconductor wafers.

In yet another embodiment, a method includes forming a copper pad layer in a dielectric layer on at least two semiconductor wafers; performing a CMP process on each of the at least two semiconductor wafers to expose the copper pad layer and planarize the dielectric layer to form a bonding face on each of the at least two semiconductor wafers; performing an oxidation process on each of the at least two semiconductor wafers to form a copper oxide to a predetermined depth in the copper pad layers; performing an oxide etch process on each of the at least two semiconductor wafers to remove the copper oxide, exposing a recessed surface of each of the copper pad layers; aligning the bonding faces on the at least two semiconductor wafers in a face to face relation; physically contacting the bonding faces of the at least two semiconductor wafers; and thermally annealing the at least two semiconductor wafers; wherein bonding occurs between the respective dielectric layers and between the respective copper pad layers of the at least two semiconductor wafers.

In still another embodiment, in the above method, performing an oxidation process on each of the at least two semiconductor wafers comprises performing an $O_2$ plasma process. In still another embodiment, in the above method, performing an oxide etch process on each of the at least two semiconductor wafers comprises performing a dilute HF etch process. In still another method, performing the anneal comprises performing an anneal at a temperature greater than 100 degrees C. In still another embodiment, in the above method, performing the anneal comprises performing an anneal at a temperature greater than 250 degrees C.

Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A method, comprising:
   forming a metal pad layer in a dielectric layer over at least two semiconductor substrates;
   performing chemical mechanical polishing on the semiconductor substrates to expose a surface of the metal pad layers and to planarize the dielectric layer to form a bonding surface on each semiconductor substrate;
   performing an oxidation process on the at least two semiconductor substrates to oxidize the metal pad layers to form a metal oxide;
   performing an etch to remove the metal oxide, exposing the surface of the metal pad layers from the bonding surface of the dielectric layer of each of the at least two semiconductor substrates;
   physically contacting the bonding surfaces of the at least two semiconductor substrates; and
   performing a thermal anneal to form bonds between the metal pad layers of the semiconductor substrates.

2. The method of claim 1, wherein forming the metal pad layer comprises forming one taken from the group consisting essentially of copper, aluminum, copper aluminum, nickel, aluminum germanium, and alloys thereof.

3. The method of claim 1, wherein forming the metal pad layer comprises forming copper.

4. The method of claim 1, wherein performing an oxidation process on the semiconductor substrates comprises performing a wet oxidation.

5. The method of claim 1, wherein performing an oxidation process on the at least two semiconductor substrates comprises performing one chosen from the group consisting essentially of an $O_2$ plasma, thermal oxidation, and in situ steam generation oxidation.

6. The method of claim 1, wherein performing an etch to remove the metal oxide comprises performing an etch using dilute HF.

7. The method of claim 1, wherein performing an etch to remove the metal oxide comprises performing one taken from the group consisting essentially of dilute HF, HCl, HCOOH, and citric acid etches.

8. The method of claim 7, and further comprising performing the etch at temperatures that are less than 250 degrees C.

9. The method of claim 1, wherein the anneal is performed at a temperature of greater than 100 degrees C. and less than 400 degrees C.

10. The method of claim 1, wherein the anneal is performed at a temperature of greater than 250 degrees C.

11. The method of claim 1 wherein after the oxide removal, the metal pads are recessed beneath the bonding surface of the semiconductor substrates by less than about 10 Angstroms.

12. The method of claim 1, wherein surface profiles of the metal pads of the at least two semiconductor substrates after the oxide removal meet a predetermined profile match parameter.

13. A method of bonding semiconductor wafers, comprising:
   forming a metal pad layer in a dielectric layer on at least two semiconductor wafers;
   performing a CMP process on each of the at least two semiconductor wafers to expose the metal pad layer and planarize the dielectric layer to form a bonding face on each of the at least two semiconductor wafers;
   performing an oxidation process on each of the at least two semiconductor wafers to form a metal oxide in the metal pad layers;
   performing an oxide etch process on each of the at least two semiconductor wafers to remove the metal oxide, exposing a recessed surface of each of the metal pad layers;
   determining that the recessed surface of each of the metal pad layers meets a profile match criterion;
   responsive to the determining, aligning the bonding faces on the at least two semiconductor wafers in a face to face relation;
   physically contacting the bonding faces of the at least two semiconductor wafers; and
   subsequently annealing the at least two semiconductor wafers;
   wherein bonding occurs between the dielectric layers and between the metal pad layers of the at least two semiconductor wafers.

14. The method of claim 13, wherein the profile match criterion comprises a recess depth from the surface of the dielectric layer to the planar surface of the metal pad layer of less than or equal to 10 Angstroms.

15. The method of claim 13, wherein the profile match criterion comprises determining that a recess depth of one of the semiconductor wafers from the surface of the dielectric layer to the planar surface of the metal pad layer in Angstroms plus 20 is less than the recess depth from the surface of the dielectric layer to the planar surface of the metal pad layer in Angstroms of the other one of the semiconductor wafers.

16. A method of wafer bonding, comprising:
   forming a copper pad layer in a dielectric layer on at least two semiconductor wafers;
   performing a CMP process on the dielectric layer on each of the at least two semiconductor wafers to expose the copper pad layer and planarize the dielectric layer to form a bonding face on each of the at least two semiconductor wafers;
   performing an oxidation process on each of the at least two semiconductor wafers to form a copper oxide to a predetermined depth in the copper pad layers;
   performing an oxide etch process on each of the at least two semiconductor wafers to remove the copper oxide, exposing a recessed planar surface of each of the copper pad layers;
   aligning the bonding faces on the at least two semiconductor wafers in a face to face relation;
   physically contacting the bonding faces of the at least two semiconductor wafers; and
   thermally annealing the at least two semiconductor wafers;
   wherein bonding occurs between the dielectric layers and between the copper pad layers of the at least two semiconductor wafers.

17. The method of claim 16 wherein performing an oxidation process on each of the at least two semiconductor wafers comprises performing an $O_2$ plasma process.

18. The method of claim 17 wherein performing an oxide etch process on each of the at least two semiconductor wafers comprises performing a dilute HF etch process.

19. The method of claim 18, wherein performing the anneal comprises performing an anneal at a temperature greater than 100 degrees C.

20. The method of claim 18, wherein performing the anneal comprise performing an anneal at a temperature greater than 250 degrees C.

* * * * *